United States Patent
Tsai et al.

(10) Patent No.: US 7,880,514 B2
(45) Date of Patent: Feb. 1, 2011

(54) OUTPUT BUFFER WITH HIGH DRIVING ABILITY

(75) Inventors: Chien-Hung Tsai, Tainan (TW);
Jia-Hui Wang, Tainan (TW);
Jing-Chuan Qiu, Tainan (TW);
Chen-Yu Wang, Tainan County (TW)

(73) Assignees: Himax Technologies Limited, Tainan County (TW); NCKU Research & Development Foundation, Tainan (TW)

( * ) Notice: Subject to any disclaimer, the term of this patent is extended or adjusted under 35 U.S.C. 154(b) by 31 days.

(21) Appl. No.: 12/350,653

(22) Filed: Jan. 8, 2009

(65) Prior Publication Data

US 2010/0171531 A1 Jul. 8, 2010

(51) Int. Cl.
*H03K 3/00* (2006.01)
(52) U.S. Cl. ...................................... 327/108
(58) Field of Classification Search ........................ None
See application file for complete search history.

(56) References Cited

U.S. PATENT DOCUMENTS

2008/0169847 A1* 7/2008 Takenaka .................... 327/108
2009/0085613 A1* 4/2009 Cowles et al. ............... 327/108

* cited by examiner

*Primary Examiner*—Lincoln Donovan
*Assistant Examiner*—Khareem E Almo
(74) *Attorney, Agent, or Firm*—J.C. Patents (57) ABSTRACT

An output buffer including a first differential input stage, a primary output stage, and a secondary output stage is provided herein. The first differential input stage respectively receives a first and a second input signals via a first and a second input terminals. The primary output stage includes a first and a second output stages. The first output stage provides at least one first level voltage according to the first and the second input signals, and the second output stage controlled by the first level voltage drives an output terminal of the output buffer to a target level. The secondary output stage includes a comparator and a third output stage. The comparator compares the induced currents in the first differential input stage, and thereby generates a control voltage. The third output stage controlled by the control voltage drives the output terminal of the output buffer to the target level.

14 Claims, 4 Drawing Sheets

OUTPUT BUFFER WITH HIGH DRIVING ABILITY

BACKGROUND OF THE INVENTION

1. Field of Invention

The present invention relates to an output buffer, and more particular, to an output buffer having dual paths of charging/discharging for enhancing the driving ability.

2. Description of Related Art

Various types of electronic devices have display devices, such as TVs, laptop computers, monitors and mobile communication terminals. The display devices are requested to be thin and/or light in order to save the volume and the cost of the electronic devices. To satisfy these requirements, various Flat Panel Displays (FPDs) have been developed as alternatives to more conventional cathode ray tube displays.

A liquid crystal display (LCD) is one kind of the FPDs. In the LCD device, a source driver plays an important role, which converts the digital video data into driving voltages and delivers the driving voltages to pixels on a display panel of the LCD. The source driver includes an output buffer for enhancing the driving ability of the driving voltage so as to avoid signal attenuation.

Figure 1:
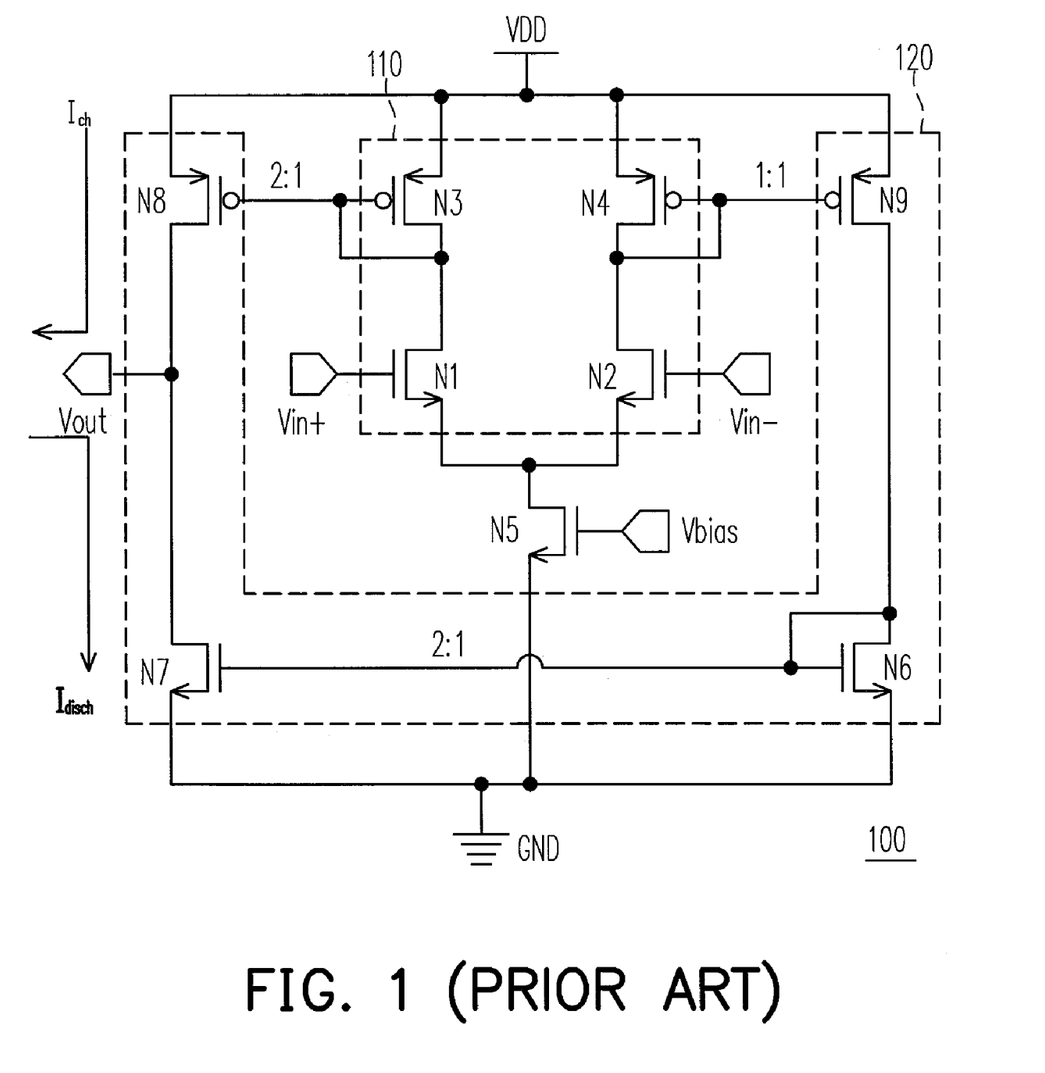
FIG. 1 shows a conventional output buffer of a source driver.

FIG. 1 shows a conventional output buffer 100 of a source driver. The output buffer 100 includes an input stage 110, a current source, and an output stage 120. The input stage 110 includes transistors N1 through N4. The transistors N1 and N2 compose a differential pair which receives differential input signals at input nodes Vin+ and Vin−. The current source implemented by a transistor N5 provides a bias current to the input stage 110. The output stage 120 includes transistors N6 through N9 to output an output voltage at an output node Vout according to the differential input signals at input nodes Vin+ and Vin−.

The output buffer 100 is used as a unit-gain buffer by connecting the output node Vout to the input node Vin−, such that the output buffer 100 is under a static state when the differential input signals at the input nodes Vin+ and Vin− are equal. When the output buffer 100 is under a transient state, it can either be under a charge state or under a discharge state. If the signal at the input node Vin+ is higher than the signal at the input node Vin−, the output buffer 100 is under the charge state so as to pull high the voltage at the output node Vout. During this charge state, the current flowing through transistors N1 and N3 is comparatively larger than the current flowing through the transistors N2 and N4, such that the charge current $I_{ch}$ flowing through the transistor N8, mirrored from the current from the transistor N3, is rising so as to quickly pull high the voltage at the output node Vout.

If the signal at the input node Vin− is higher than the signal at the input node Vin+, the output buffer 100 is under the discharge state. During this discharge state, the current flowing through the transistors N2 and N4 is comparatively larger than the current flowing through the transistors N1 and N3, such that the charge current flowing through the transistor N9, mirrored from the current from the transistor N4, becomes larger, and thus the discharge current $I_{disch}$, mirrored from the current of transistor N6, is rising to quickly pull low the voltage at the output node Vout.

However, the size of the display panel is getting larger, and thus the larger charge current $I_{ch}$ and the discharge current $I_{disch}$ are required for driving larger display panel.

SUMMARY OF THE INVENTION

According, the present invention provides an output buffer having dual paths of charging/discharging for increasing the driving ability.

An output buffer adapted to a source driver is provided in the present invention. The output buffer includes a first differential input stage, a primary output stage, and a secondary output stage. The first differential input stage respectively receives a first input signal and a second input signal via a first input terminal and a second input terminal. A first current and a second current are respectively induced in the first differential input stage according to the first input signal and the second input signal. The primary output stage includes a first output stage and a second output stage. The first output stage provides at least one first level voltage according to the first input signal and the second input signal, and the second output stage drives an output terminal of the output buffer to a target level under the control of the first level voltage, wherein the output terminal of the output buffer is coupled to the first input terminal of the output buffer. The secondary output stage includes a comparator and a third output stage. The comparator compares the first current with the second current and thereby generates a control voltage. The third output stage drives the output terminal of the output buffer to the target level under the control of the control voltage.

In an embodiment of the foregoing output buffer, the first output stage includes a level adjustment circuit and a bias providing circuit. The level adjustment circuit generates the first level voltage according to a first level current mirrored from the first current or mirrored from the second current. The bias providing circuit provides a first biased voltage to control the level adjustment circuit based on the second current.

In an embodiment of the foregoing output buffer, the secondary output stage includes a first comparing circuit, and a second comparing circuit having different driving ability to the first comparing circuit. The first comparing circuit compares the first current with the second current, and thereby generates a first control voltage to control the third output stage. The second comparing circuit compares the first current with the second current, and thereby generates a second control voltage to control the third output stage.

In an embodiment of the foregoing output buffer, the output buffer further includes a second differential input stage. The second differential input stage respectively receives the first input signal and the second input signal via the first input terminal and the second input terminal of the first differential input stage. A third current and a fourth current are respectively induced in the second differential input stage according to the first input signal and the second input signal. The level adjustment circuit further generates the first level voltage according to the first level current mirrored form the third current or mirrored from the fourth current. The bias providing circuit further provides a second biased voltage to control the level adjustment circuit based on the fourth current.

The present invention provides the output buffer includes plural output stages for increasing the driving ability. In order to avoiding the output voltage swing of the output buffer unstable, each output stage should be properly controlled. In the primary output stage, the level adjustment circuit biased by the first biased voltage generates the first level voltage according to the variation of the first input signal and the second input signal for controlling the second output stage. In the secondary output stage, the comparator generates the control voltage according to the induced currents in the first differential input stage for controlling the third output stage. The primary output stage and the secondary output stage provide dual paths of charging/discharging so that the driving ability of the output buffer can be increased by the increase of the dynamic current.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Reference will now be made in detail to the present embodiments of the invention, examples of which are illustrated in the accompanying drawings. Wherever possible, the same reference numbers are used in the drawings and the description to refer to the same or like parts.

Figure 2:
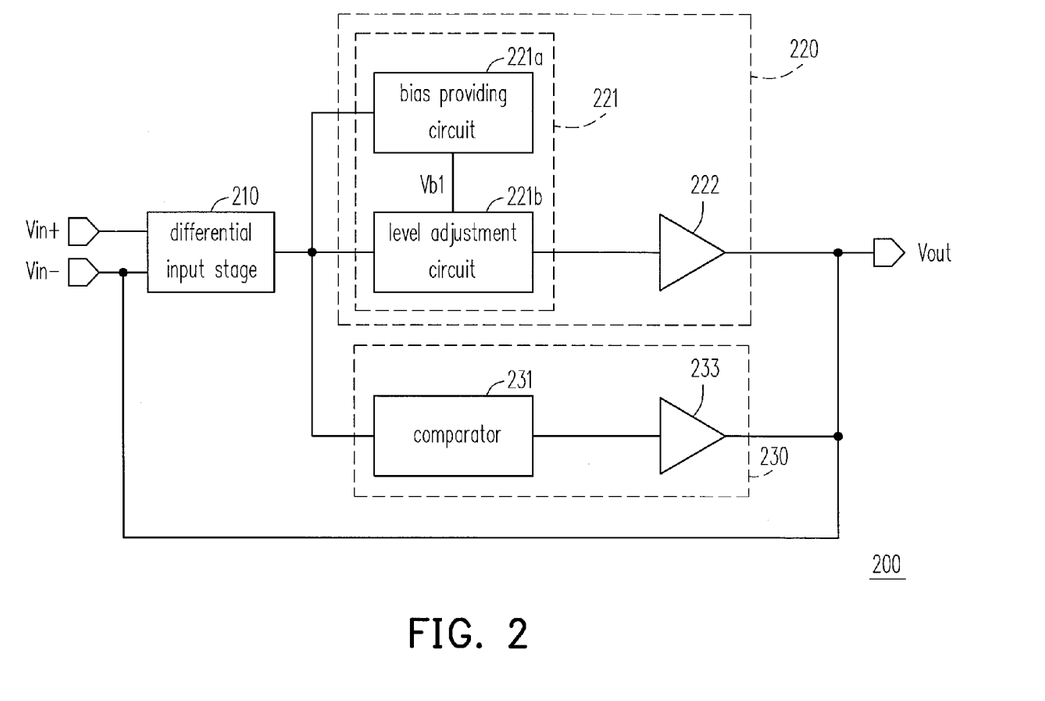
FIG. 2 is a block diagram of an output buffer according to an embodiment of the present invention.

FIG. 2 is a block diagram of an output buffer according to an embodiment of the present invention. Referring to FIG. 2, the output buffer 200 includes a differential input stage 210, a primary output stage 220 and a secondary output stage 230. The differential input stage 210 can be composed of a P-type differential pair, a N-type differential pair or rail-to-rail type differential input pairs for respectively receiving a first input signal and a second input signal via a first input terminal Vin− and a second input terminal Vin+. According to variation of the first input signal and the second input signal, dynamic currents may be induced in the differential input stage 210.

The primary output stage 220 includes a first output stage 221 composed of a bias providing circuit 221a and a level adjustment circuit 221b, and includes a second output stage 222. The bias providing circuit 221a provides a first biased voltage Vb1 to the level adjustment circuit 221b according to one of the induced currents in the differential input stage 220. In another embodiment, the first bias voltage Vb1 may be provided from an external source. The level adjustment circuit 221b provides at least one first level voltage according to the induced currents in the differential input stage 210 for controlling the second output stage 222 to drive an output terminal Vout to a target level. While the output buffer 200 is a unity gain buffer in this embodiment, the output terminal Vout of the output buffer 200 is coupled to the first input terminal Vin− of the output buffer 200. The secondary output stage 230 includes a comparator 231, and a third output stage 233. The comparator 231 compares the induced currents and thereby generates a control voltage for controlling the third output stage 233 to drive the output terminal Vout to the target level, wherein the secondary output stage 230 assists the primary output stage 220 in increasing charging and discharging speeds of the output buffer 200.

In the embodiment of the present invention, the output buffer 200 is under a static state when the first input signal and the second input signal respectively received by the first input terminal Vin− and the second input terminal Vin+ are substantially equal. Otherwise, the output buffer 200 is under a dynamic state, i.e. a charge state or a discharge state, according to the signal difference between the first input terminal Vin− and the second input terminal Vin+.

When the output buffer 200 is under the dynamic state, the level adjustment circuit 221b, driven by the first biased voltage Vb1, provides the first level voltage to the second output stage 222 for dynamically adjusting the second output stage 222 to drive the output terminal Vout to the target level. Simultaneously under the dynamic state, the comparator 231 generates the control voltage to the third output stage 233 by comparing the induced currents, so that the third output stage 233 operates to drive the output terminal Vout to the target level. As a result, the output buffer 200 has dual paths of charging/discharging the output terminal Vout, so as to enhance the driving capability thereof. It should be noticed that the dynamic state is under a charge state or a discharge state according to the first input signal and the second input signal. When the output buffer 200 is under the static state, the secondary output stage 230 may be de-activated, so as to save power consumption. The following embodiments will describe the circuit and operation of the output buffer 200 in detail.

Figure 3:
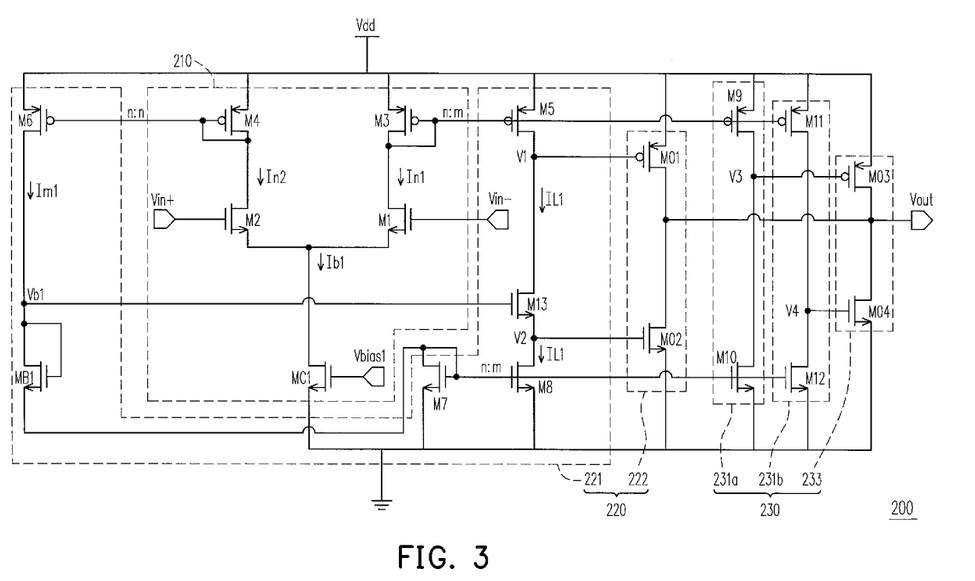
FIG. 3 shows a circuit diagram of the output buffer according to the embodiment in FIG. 2.

FIG. 3 shows a circuit diagram of the output buffer 200 according to the embodiment in FIG. 2. Referring to FIG. 3, the differential input stage 210 includes transistors M1 through M4, and MC1, wherein the transistors M1 and M2 compose an N-type differential input pair. The transistors MC1 serves as a current source for providing a first bias current Ib1 so that a first current In1 and a second current In2 are induced in the differential input stage 210 according to the signals received by the first input terminal Vin− and the second input terminal Vin+, wherein a sum of the first current In1 and the second current In2 is nearly equal to the first bias current Ib1.

The first output stage 221 of the primary output stage 220 includes transistors M5 through M8, the bias providing circuit 221a is composed of a self-bias transistor MB1, and the level adjustment circuit 221b is composed of a transistor M13. The transistor M5 mirrors the first current In1 to generate a first level current IL1 at node V1, and the transistor M6 mirrors the second current In2 to generate a first mirroring current Im1 flowing through itself. The self-bias transistor MB1 provides the first biased voltage Vb1 based on the second current In2 when the first mirroring current Im1, mirrored from the second current In2, flows through the transistor MB1.

When the first mirroring current Im1 flows to the transistor M7, the transistor M8 mirrors the first mirroring current Im1 to generate the first level current IL1 at the node V2, wherein the first level current IL1 at the node V2 originates from the second current In2. The level adjustment circuit 221b composed of the transistor M13 respectively generates a first level voltage and a second level voltage at nodes V1 and V2 according to the first level current IL1 mirrored from the first current In1 or mirrored from the second current In2. Since the nodes V1 and V2 are in the same current path when the transistor M13 is conducted, the symbol "IL1" is quoted to represent the currents induced at the nodes V1 and V2.

The second output stage 222 of the primary output stage 220 includes transistors MO1 and MO2. The ON/OFF states of the transistors MO1 and MO2 are determined by the first level voltage and the second level voltage at nodes V1 and V2, and thereby the second output stage 222 can generate a charge current when the transistor MO1 is turned on, and generate a discharge current when the transistor MO2 is turned on, so that the second output stage drives the output terminal Vout under the control of the level voltages provided by the level adjustment circuit 221b.

The comparator 231 of the secondary output stage 230 includes comparing circuit 231a and 231b. The comparing circuit 231a includes transistors M9 and M10. The transistors M3 and M9 forms a current mirror structure for inducing a current mirrored from the first current In1 at node V3, and the transistors M7 and M10 forms a current mirror structure for inducing the current mirrored from the second current In2 at node V3. The comparing circuit 231a generates a first control voltage at node V3 according to the induced current at node V3. In addition, the comparing circuit 231b includes transistors M11 and M12. Similarly, the comparing circuit 231b generates a second control voltage at node V4 according the induced current at node V4 mirrored from the first current In1 or mirrored from the second current In2. The comparing circuits 231a and 231b have different driving abilities, which can be implemented by designing the width-to-length ratio of the transistor.

The third output stage 233 of the secondary output stage 230 includes transistors MO3 and MO4. The ON/OFF states of the transistors MO3 and MO4 are determined by the first control voltage and the second control voltage at nodes V3 and V4, and thereby the third output stage 233 can generate a charge current when the transistor MO3 is turned on, and generate a discharge current when the transistor MO4 is turned on, so that the second output stage 222 drives the output terminal Vout to a target level under the control of the control voltages provided by the comparing circuits 231a and 231b.

When the input voltage at the first input terminal Vin− (i.e. the first input signal) is less than the input voltage at the second input terminal Vin+ (i.e. the second input signal), the output buffer 200 is under the charge state to pull high the voltage at the output terminal Vout. That is, the second current In2 flowing through the transistors M2 and M4 is greater than the first current In1 flowing through the transistors M1 and M3. In the primary output stage 220, the first mirroring current Im1 flowing through the transistor M6, mirrored from the second current In2, becomes larger, such that the self-bias transistor MB1 can provide the first biased voltage Vb1 with high level to turn on the transistor M13 or bias the transistor M13 to the liner region, in the meanwhile, the first level current IL1 flowing through the transistor M7, mirrored from the first mirroring current Im1, becomes larger to pull low the voltages at the nodes V1 and V2. The transistor MO1 of the second output stage 222 is turned on to provide the charge current, and then pull high the voltage at the output terminal Vout.

Besides, in the secondary output stage 230, since the second current In2 is greater than the first current In1, the first control voltage at the node V3 provided by the comparing circuit 231a is mainly determined by the induced current at the node V3 mirrored from the second current In1, so does the second control voltage at the node V4 provided by the second comparing circuit 231b. The first control voltage at the node V3 and the second control voltage at the node V4 are pulled low to turn on the transistor MO3 and turn off the transistor MO4, respectively. Thus, the third output stage 233 also provides a charge current to pull high the voltage at the output terminal Vout. Therefore, there are dual paths of charging respectively in the primary output stage 220 and the secondary output stage 230 of the output buffer 200.

When the input voltage at the first input terminal Vin− (i.e. the first input signal) is greater than the input voltage at the second input terminal Vin+ (i.e. the second input signal), the output buffer 200 is under the discharge state to pull low the voltage at the output terminal Vout. That is, the first current In1 flowing through the transistors M1 and M3 is greater than the second current In2 flowing through the transistors M2 and M4. In the primary output stage 220, if the second current In2 is decreased, but the first mirroring current Im1, mirrored from the second current In2, is sufficient to make the self-bias transistor MB1 produce the first biased voltage Vb1 to bias the transistor M13, the first level current IL1 flowing through the transistor M5, mirrored from the first current In1, becomes larger to pull high the voltages at the nodes V1 and V2. The transistor MO2 of the second output stage 222 is turned on to provide a discharge current, and then pull low the voltage at the output terminal Vout.

Under some circumstance, e.g. the first mirroring current Im1 is too small to make the self-bias transistor MB1 produce enough first biased voltage Vb1, the first level voltage at the node V1 may be in high level (e.g. close to power voltage VDD) to turn off the transistor MO1, and the second level voltage at the node V1 may be in low level (e.g. close to ground voltage VSS) to turn off the transistor MO1. Although the second output stage 222 can not provide discharge current under this circumstance, the secondary output stage 230 still operate normally for driving the load.

In the secondary output stage 230, since the first current In1 is greater than the second current In2, the first control voltage at the node V3 provided by the comparing circuit 231a is mainly determined by the induced current at the node V3 mirrored from the first current In1, and so does the second control voltage at the node V4 provided by the comparing circuit 231b. That is to say the first control voltage at the node V3 and the second control voltage at the node V4 are pulled high to turn off the transistor MO3 and turn on the transistor MO4, respectively. Thus, the third output stage 233 provides a discharge current to pull low the voltage at the output terminal Vout. Therefore, there are dual paths of discharging respectively in the primary output stage 220 and the secondary output stage 230 of the output buffer 200.

In the embodiment of the present invention in FIG. 3, the transistor M13 of the level adjustment circuit, driven by the first biased voltage Vb1, can adjust gate-source voltages of the transistors MO1 and MO2, wherein the gate-source voltage of the transistor affects amount of the dynamic charge/discharge current provided by the second output stage 222. In addition, the transistor M13 keeps a small gap voltage between the gates of the transistors MO1 and MO2 for avoiding the transistors MO1 and MO2 to turn on simultaneously. The second output stage 222 controlled by the first level voltage and the second level voltage forms one of the dual paths of charging/discharging. Since the first biased voltage Vb1 is provided by the output buffer 200 itself, there is no need of additional biased circuit so as to reduce the power consumption. The comparing circuits 231a and 231b having different driving abilities, e.g. the comparing circuit 231b has smaller driving ability to the comparing circuit 231, can also keep small gap voltage between the gates of the transistors MO3 and MO4 for avoiding the transistors MO3 and MO4 to turn on simultaneously. The third output stage 233 controlled by the comparing circuits 231a and 231b forms the other of the dual paths of charging/discharging, so that the dynamic charge/discharge current of the output buffer 200 can be increased for driving heavy load, e.g. a display panel with large size.

It is noted that the said description concerns the output buffer 200 under dynamic state. Instead of increasing a static current to obtain higher dynamic current in some related arts, which may cause high power consumption, the said embodiment in FIG. 3 utilizes the dual paths of charging/discharge to increase dynamic current for obtaining high driving ability. Although the differential input stage 210 of the said embodiment in FIG. 3, which has the N-type differential input pair composed of the transistors M1 and M2, is exemplary, people ordinarily skill in the art can also practice the present invention by P-type differential input pair, so that the present invention is not limited thereto. In addition, by properly designing width-to-length ratios of the transistors M9 through M12, the comparing circuits 231a and 231b can be de-activated when the output buffer 200 is under static state. In the embodiment of the present invention, the width-to-length ratio of the transistor M9 is larger than the width-to-length ratio of the transistor M10, and the width-to-length ratio of the transistor M12 is larger than the width-to-length ratio of the transistor M11.

Figure 4:
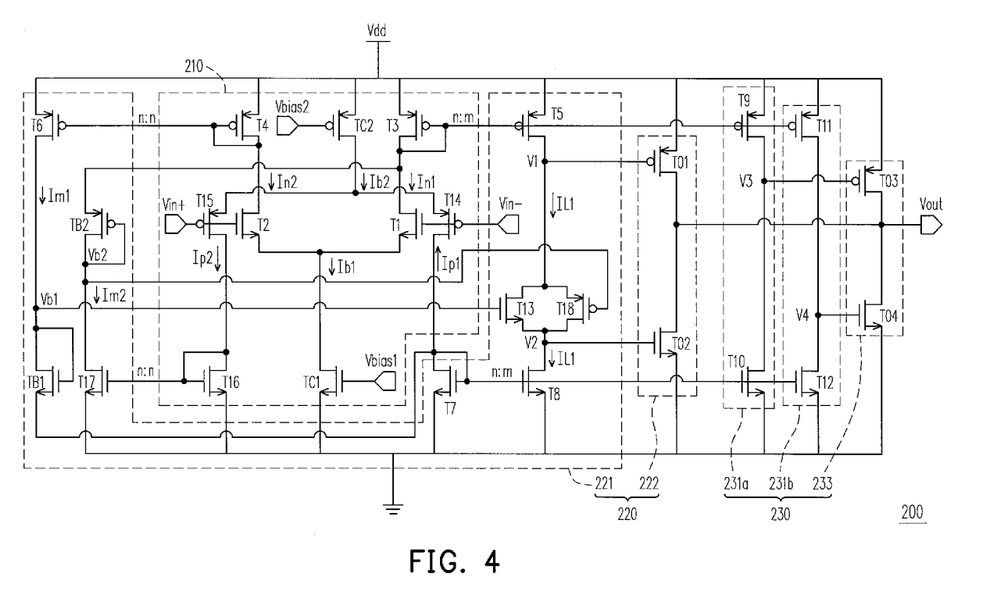
FIG. 4 shows a circuit diagram of the output buffer according to the embodiment in FIG. 2.

FIG. 4 shows a circuit diagram of the output buffer 200 according to the embodiment in FIG. 2. For convenience of description, some symbols, e.g. Ib1, In1, In2, V1 and etc., are quoted from the embodiment of FIG. 3 herein. Referring to FIG. 4, transistors T1 through T4, and TC1 compose a first differential input stage similar to the differential input stage 210 in FIG. 3, so that the detail is not iterated. Transistors T15 through T17, and TC2 compose a second differential input stage. The N-type transistors T1 and T2 and the P-type transistor T15 and T16 form the rail-to-rail type differential input pairs for increasing a common-mode input range of the output buffer 200. The transistor TC2 serves as a current source for providing a second bias current Ib2 to the second differential input stage so that a third current Ip1 and a fourth current Ip2 are induced in the second differential input stage according to the first input signal and the second input signal, wherein a sum of the third current Ip1 and the fourth current Ip2 is nearly equal to the second bias current Ib2.

Referring to FIG. 4, the first output stage of the primary output stage 220 includes transistors T5 through T8, T17, the bias providing circuit composed of self-bias transistors TB1 and TB2, and the level adjustment circuit composed of transistors T13 and T18. The operation of the transistors T5 through T7 is similar to the operation of the transistor M5 through M7 in the embodiment of FIG. 3. With regard to the first differential input stage, the transistor T5 mirrors the first current In1 to generate the first level current IL1 at the node V1, and the transistor M6 mirrors the second current In2 to generate the first mirroring current Im1 flowing through itself so that the self-bias transistor TB1 can provide the first biased voltage Vb1 to bias a transistor T13 of the level adjustment circuit based on the second current In2. When the first mirroring current Im1 flows to the transistor T7, the transistor T8 mirrors the first mirroring current Im1 to generate the first level current IL1 at the node V2.

Similarly, with regard to the second differential input stage, the transistor T8 mirrors the third current Ip1 to generate the first level current IL1 at the node V2, and the transistor T17 mirrors the fourth current Ip2 to generate a second mirroring current Im2 flowing through itself. The self-bias transistor TB2 can provide a second biased voltage Vb2 to bias the transistor T18 based on the second mirroring current Im2, mirrored from the fourth current. Since the transistors T3, T17 and TB2 are in the same current path, the transistor T5 can mirrors the second mirroring circuit Im2 to generate the first level current IL1 at the node V1. Therefore, the level adjustment circuit composed of the transistors T13 and T18 generates the first level voltage and the second level voltage at the nodes V1 and V2 according to the first level current IL1 so as to control the second output stage composed of the transistors TO1 and TO2. The operation of the secondary output stage 230 in FIG. 4 is similar to the operation of the secondary output stage 230 in FIG. 4 so that the detail is not iterated.

Generally, one advantage of the rail-to-rail type differential input pairs is that the output buffer 200 can operate under wide input voltage range. The voltage levels of the signals received by the first input terminal Vin− and the second input terminal Vin+ would drive the N-type differential input pair composed of the transistors T1 and T2, or the P-type differential input pair composed of the transistors T14 and T15, or both of them to operate. The following gives an example for describing the operation of the output buffer 200 in the embodiment of FIG. 4.

It is assumed that the input voltages respectively received by the first input terminal Vin− and the second input terminal Vin+ are median voltages, which make both of the N-type differential input pair and the P-type differential input pair operate. When the input voltage at the first input terminal Vin− (i.e. the first input signal) is less than the input voltage at the second input terminal Vin+ (i.e. the second input signal), the output buffer 200 is under the charge stage. That is, the second current In2 is greater than the first current In1, and the third current Ip1 is greater than the fourth current Ip2. In the primary output stage 220, the first mirroring current Im1 flowing through the transistor T6 becomes larger, and the self-bias transistor TB1 provides the first biased voltage Vb1 to turn on the transistor T13 or bias the transistor T13 in the linear region. Simultaneously, the transistor T8 generates the first level current IL1 at the node V2, which originates from the second current In2 and the third current Ip1 and becomes larger, so that the voltages at the nodes V1 and V2 are pulled low to turn on the transistor TO1 of the second output stage. As a result, the second output stage provides a charge current to the output terminal Vout, and pulls high the voltage at the output terminals Vout. In the secondary output stage 230, the voltages at the nodes V3 and V4 are mainly determined by the induced currents of the transistors T10 and T12, respectively, and the voltages at the nodes V3 and V4 are pulled low to turn on the transistor TO3 and turn off the transistor TO4, so that the third output stage 232 also provides a charge current to the output terminal Vout, and pulls high the voltage at the output terminals Vout.

When the input voltage at the first input terminal Vin− (i.e. the first input signal) is greater than the input voltage at the second input terminal Vin+ (i.e. the second input signal), the output buffer 200 is under the discharge stage. That is, the first current In1 is greater than the second current In2, and the fourth current Ip2 is greater than the third current Ip1. In the primary output stage 220, the second mirroring current Im2 flowing through the transistor T17 becomes larger, and the self-bias transistor TB2 provides the second biased voltage Vb2 to turn on the transistor T14 or bias the transistor T14 in the linear region. Simultaneously, the transistor T5 generates the first level current IL1 at the node V1, which originates from the first current In2 and the fourth current Ip2, and becomes larger, so that the voltages at the nodes V1 and V2 are pulled high to turn on the transistor TO2. As a result, the second output stage 222 provides a discharge current, and pulls low the voltage at the output terminals Vout. In the secondary output stage, since the first current In1 and the fourth current Ip2 become larger, the voltages at the nodes V3 and V4 are mainly determined by the induced current of the transistors T9 and T11, respectively, and the voltages at the nodes V3 and V4 are pulled high to turn on the transistor TO4 and turn off the transistor TO3, so that the third output stage 232 also provides a discharge current, and pulls low the voltage at the output terminals Vout.

In summary, the primary output stage 220 of the output buffer 200 includes two output stages, i.e. the first output stage 221 and the second output stage 222, for increasing the output gain of the output buffer 200, and forms one of dual paths of charging/discharging. In the primary output stage 221, the level adjustment circuit is properly biased to adjust the first level voltage and the second level voltage at the nodes V1 and V2 to control the second output stage 222. The secondary output stage 230 of the output buffer 200 forms the other of the dual paths of charging/discharging. In the secondary output stage 230, the comparing circuits 231a and 231b dynamically adjust the first control voltage and the second control voltage to control the third output stage 233. By increasing dynamic current, the output buffer 200 has high speed charging and/or discharging ability.

It will be apparent to those skilled in the art that various modifications and variations can be made to the structure of the present invention without departing from the scope or spirit of the invention. In view of the foregoing descriptions, it is intended that the present invention covers modifications and variations of this invention if they fall within the scope of the following claims and their equivalents.

What is claimed is:

1. An output buffer, adapted to a source driver, comprising:
   a first differential input stage, having a first terminal for receiving a first input signal, and a second input terminal for receiving a second input signal, wherein a first current and a second current are respectively induced in the first differential input stage according to the first input signal and the second input signal;
   a primary output stage, comprising:
      a first output stage, coupled to the first differential input stage for providing at least one first level voltage according to the first input signal and the second input signal, the first output stage comprising:
      a level adjustment circuit, generating the first level voltage according to a first level current mirrored from the first current or the second current; and
      a bias providing circuit, providing a first biased voltage to control the level adjustment circuit based on the second current; and
      a second output stage, driving an output terminal of the output buffer coupled to the first terminal of the first differential input stage to a target level under the control of the first level voltage; and
   a secondary output stage, comprising:
      a comparator, coupled to the first differential input stage for comparing the first current with the second current, and thereby generating a control voltage, the comparator further comprising:
      a first comparing circuit, coupled to the first differential input stage for comparing the first current with the second current, and thereby generating a first control voltage to control a third output stage; and
      a second comparing circuit, coupled to the first differential input stage for comparing the first current with the second current, and thereby generating a second control voltage to control the third output stage, wherein the first comparing circuit and the second comparing circuit have different driving abilities, and the first control voltage and the second control voltage have a voltage offset; and
      the third output stage, driving the output terminal of the output buffer to the target level under the control of the control voltage.

2. The output buffer as claimed in claim 1, wherein the first differential input stage comprises:
   a first transistor, having a gate serving as the first input terminal, a first source/drain inducing the first current, and a second source/drain;
   a second transistor, having a gate serving as the second input terminal, a first source/drain inducing the second current, and a second source/drain coupled to the second source/drain of the first transistor;
   a third transistor, having both of a gate and a first source/drain coupled to the first source/drain of the first transistor, and a second source/drain coupled to a first voltage;
   a fourth transistor, having both of a gate and a first source/drain coupled to the first source/drain of the second transistor, and a second source/drain coupled to the first voltage; and
   a first current source, coupled between the second source/drain of the first transistor and a second voltage for providing a first bias current to the first differential input stage, wherein a sum of the first current and the second current is nearly equal to the first bias current.

3. The output buffer as claimed in claim 2, wherein the first output stage further comprises:
   a fifth transistor, having a gate coupled to the gate of the third transistor, a first source/drain inducing the first level current mirrored from the first current, and a second source/drain coupled to the first voltage;
   a sixth transistor, having a gate coupled to the gate of the fourth transistor, a first source/drain inducing the first mirroring circuit mirrored from the second current, and a second source/drain coupled to the first voltage;
   a seventh transistor, having both of a gate and a first source/drain coupled to the first source/drain of the sixth transistor, and a second source/drain coupled to the second voltage; and
   an eighth transistor, having a gate coupled to the gate of the seventh transistor, a first source/drain inducing the first level current mirrored from the first mirroring circuit, and a second source/drain coupled to the second voltage.

4. The output buffer as claimed in claim 3, wherein the bias providing circuit comprises a first self-bias transistor having both of a gate and a first source/drain coupled to the first source/drain of the sixth transistor for outputting the first biased voltage, and a second source/drain coupled to the first source/drain of the seventh transistor.

5. The output buffer as claimed in claim 3, wherein the first comparing circuit comprises:
   a ninth transistor, having a gate coupled to the gate of the third transistor, a first source/drain outputting the first control voltage, and a second source/drain coupled to the first voltage; and
   a tenth transistor, having a gate coupled to the gate of the seventh transistor, a first source/drain coupled to the first source/drain of the ninth transistor, and a second source/drain coupled to the second voltage.

6. The output buffer as claimed in claim 3, wherein the second comparing circuit comprises:
   an eleventh transistor, having a gate coupled to the gate of the third transistor, a first source/drain outputting the second control voltage, and a second source/drain coupled to the first voltage; and a twelfth transistor, having a gate coupled to the gate of the seventh transistor, a first source/drain coupled to the first source/drain of the eleventh transistor, and a second source/drain coupled to the second voltage.

7. The output buffer as claimed in claim 3, wherein the level adjustment circuit comprises:
a thirteenth transistor, having a gate coupled to the first biased voltage, a first source/drain coupled to the first source/drain of the fifth transistor, and a second source/drain coupled to the first source/drain of the eighth transistor, wherein the first level voltage is outputted from one of the first source/drain and the second source/drain of the thirteenth transistor.

8. The output buffer as claimed in claim 7, wherein the second output stage comprises:
a first output transistor, having a gate coupled to the first source/drain of the thirteenth transistor, a first source/drain coupled to the output terminal of the output buffer, and a second source/drain coupled to the first voltage; and
a second output transistor, having a gate coupled to the second source/drain of the thirteenth transistor, a first source/drain coupled to the first source/drain of the first output transistor, and a second source/drain coupled to the second voltage.

9. The output buffer as claimed in claim 3, further comprising:
a second differential input stage, respectively receiving the first input signal and the second input signal via a first input terminal and a second input terminal of the first differential input stage, wherein a third current and a fourth current are respectively induced in the second differential input stage according to the first input signal and the second input signal, the level adjustment circuit generates the first level voltage according to the first level current mirrored from the third current or the fourth current, and the bias providing circuit provides a second biased voltage to control the level adjustment circuit based on the fourth current.

10. The output buffer as claimed in claim 9, wherein the second differential input stage comprises:
a fourteenth transistor, having a gate coupled to the gate of the first transistor, a first source/drain coupled to the first source/drain of the seventh transistor for inducing the third current, and a second source/drain;

a fifteenth transistor, having a gate coupled to the gate of the second transistor, a first source/drain inducing the fourth current, and a second source/drain coupled to the second source/drain of the fifteenth transistor;
a sixteenth transistor, having both of a gate and a first source/drain coupled to the first source/drain of the fifteenth transistor, and a second source/drain coupled to the second voltage; and
a second current source, coupled between the second source/drain of the fourteenth transistor and the first voltage for providing a second bias current to the second differential input stage, wherein a sum of the third current and the fourth current is nearly equal to the second bias current.

11. The output buffer as claimed in claim 10, wherein the first output stage comprises:
an seventeenth transistor, having a gate coupled to the gate of the sixteenth transistor, a first source/drain coupled to the first source/drain of the first transistor for inducing a second mirroring current mirrored from the fourth current, and a second source/drain coupled to the second voltage.

12. The output buffer as claimed in claim 11, wherein the bias providing circuit comprises a second self-bias transistor having both of a gate and a first source/drain coupled to the first source/drain of the seventeenth transistor for outputting a second biased voltage, and a second source/drain coupled to the first source/drain of the first transistor.

13. The output buffer as claimed in claim 12, wherein the level adjustment circuit comprises:
an eighteenth transistor, having a gate coupled to the second biased voltage, a first source/drain coupled to the first source/drain of the eighth transistor, and a second source/drain coupled to the second source/drain of the fifth transistor.

14. The output buffer as claimed in claim 2, wherein the third output stage comprises:
a third output transistor, having a gate coupled to the first control voltage, a first source/drain coupled to the output terminal of the output buffer, and a second source/drain coupled to the first voltage; and
a fourth output transistor, having a gate coupled to the second control voltage, a first source/drain coupled to the first source/drain of the third output transistor, and a second source/drain coupled to the second voltage.

* * * * *